(12) United States Patent
Allen et al.

(10) Patent No.: US 7,302,653 B2
(45) Date of Patent: Nov. 27, 2007

(54) PROBABILITY OF FAULT FUNCTION DETERMINATION USING CRITICAL DEFECT SIZE MAP

(75) Inventors: Robert J. Allen, Jericho, VT (US); Mervyn Y. Tan, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 296 days.

(21) Appl. No.: 10/906,548

(22) Filed: Feb. 24, 2005

(65) Prior Publication Data

US 2006/0190222 A1 Aug. 24, 2006

(51) Int. Cl.
*G06F 17/50* (2006.01)

(52) U.S. Cl. ......................................................... 716/4

(58) Field of Classification Search .................... 716/4, 716/10; 703/2
See application file for complete search history.

(56) References Cited

U.S. PATENT DOCUMENTS

| | | | |
|---|---|---|---|
| 6,044,208 | A | 3/2000 | Papadopoulou et al. |
| 6,178,539 | B1 | 1/2001 | Papadopoulou et al. |
| 6,247,853 | B1 | 6/2001 | Papadopoulou et al. |
| 6,317,859 | B1 | 11/2001 | Papadopoulou |

OTHER PUBLICATIONS

Maynard, Daniel N., et al., "Measurement and reduction of critical area using Vorooi diagrams", Jan. 2005, IEEE, SEMI Advanced Semiconductor manufacturing conference. pp. 1-7.*
Papadopoulou, E. et al., "Critical Area Computation via Voronoi Diagrams," IEEE Transactions on Computer-Aided Design, vol. 18, No. 4, Apr. 1999, pp. 463-474.
Papadopoulou, E. et al., "The L∞ Voronoi Diagram of Segments and VLSI Applications," International Journal of Computational Geometry & Applications, vol. 11, No. 5, 2001, pp. 503-528.
Papadopoulou, E., "Critical Area Computation for Missing Material Defects in VLSI Circuits," IEEE Transactions on Computer-Aided Design of Integrated Circuits and Systems, vol. 20, No. 5, May 2001, pp. 583-597.
Sunday, D., "Area of Triangles and Polygons (2D & 3D)," Algorithm 1, http://softsurfer.com/archive/algorithm_0101/algorithm_0101.htm, Jan. 6, 2005, pp. 1-14.
Subramanian, K., "Yield Estimation Based on Layout & Process Data," Master's Thesis Work, Mar. 2003, pp. 1-17.

* cited by examiner

*Primary Examiner*—Stacy Whitmore
(74) *Attorney, Agent, or Firm*—Richard M. Kotulak; Hoffman, Warnick & D'Alessandro LLC

(57) ABSTRACT

Methods, systems and program products for determining a probability of fault (POF) function using critical defect size maps. Methods for an exact or a sample POF function are provided. Critical area determinations can also be supplied based on the exact or sample POF functions. The invention provides a less computationally complex and storage-intensive methodology.

18 Claims, 13 Drawing Sheets

PROBABILITY OF FAULT FUNCTION DETERMINATION USING CRITICAL DEFECT SIZE MAP

This application is related to co-pending U.S. Ser. No. 10/906,549, entitled "Sample Probability of Fault Function Determination Using Critical Defect Size Map," filed Feb. 2, 2005, which is hereby incorporated by reference.

BACKGROUND OF THE INVENTION

1. Technical Field

The present invention relates generally to integrated circuit design, and more particularly, to determination of a probability of fault (POF) function with critical defect size maps.

2. Related Art

The "critical area" of a very large scale integrated (VLSI) circuit layout is a measure that reflects the sensitivity of the layout to defects occurring during the manufacturing process. Critical area is widely used to predict the yield of a VLSI chip. Yield prediction is essential in today's VLSI manufacturing due to the growing need to control cost. Models for yield estimation are based on the concept of critical area which represents the main computational problem in the analysis of yield loss due to spot defects during fabrication. Spot defects are caused by particles such as dust and other contaminants in materials and equipment and are classified into two types: First, "extra material" defects cause shorts between different conducting regions by causing shapes to print slightly larger as a consequence of the manufacturing process. Second, "missing material" defects create open circuits by causing shapes to print slightly smaller as a consequence of the manufacturing process. Extra material defects are the ones that appear most frequently in a typical manufacturing process and are the main reason for yield loss.

A parameter that is, in certain approaches, used to determine critical area and is also useful in evaluating an IC design relative to defects is a probability of fault (POF) function. A POF function is a measure of the probability that a random defect of a given size r landing on the IC design will cause an electrical fault in the circuit. The POF function is dependent on the IC design, and is also useful for determining random defect failure probabilities for various manufacturing process models. The POF function can also be used to analyze characteristics of an IC design as it relates to defect sensitivity. Another useful parameter is a defect density function, which is a measure of the probability that a random defect of a particular size r will occur on the chip, independent of the chip design. The POF function for a particular design is independent of the defect density function. The probability that a random defect will occur on an IC design and cause an electrical fault (e.g., short, wire breaks (opens), or via blockage) is given by:

$$\Theta = \frac{CriticalArea}{AreaOfLayout} = \int_0^\infty POF(r) DefectDensity(r) \, dr$$

Currently, there are two methods of determining critical area: a Monte Carlo approach and a critical defect size mapping approach. In the Monte Carlo approach, critical area is approximated by randomly simulating defects on the actual layout having varying sizes. In this approach, the POF function is based on statistical data, and is used to perform integration with the defect density function to determine the critical area. One problem with the Monte Carlo approach, however, is that it uses a gross approximation of the POF function, which significantly lowers accuracy of the critical area determination. In addition, run-times for a Monte Carlo analysis are an order of magnitude greater than the critical defect size mapping approach. The critical defect size mapping approach constructs a critical defect size map in the form of a Voronoi diagram based on the layout geometry, which can be used to compute an exact critical area rather than an approximation. A shortcoming of the conventional critical defect size mapping (Voronoi) approach, however, is that the POF function is not determined.

In view of the foregoing, there is a need in the art for determining a probability of fault function using a critical defect size mapping (e.g., Voronoi) approach.

SUMMARY OF THE INVENTION

The invention includes methods, systems and program products for determining a probability of fault (POF) function using critical defect size maps. Methods for an exact or a sample POF function are provided. Critical area determinations can also be supplied based on the exact or sample POF functions. The invention provides a less computationally complex and storage-intensive methodology.

A first aspect of the invention is directed to a method of determining a probability of fault (POF) function for an integrated circuit design, the method comprising the steps of: constructing a critical defect size map based on a layout geometry of the integrated circuit design under any distance measure defined by a polygonal unit shape; and accumulating a POF contribution of each face of the critical defect size map to form a piece-wise two-degree polynomial function representing the POF function.

A second aspect of the invention includes a system for determining a probability of fault (POF) function for an integrated circuit design, the system comprising: means for constructing a critical defect size map based on a layout geometry of the integrated circuit design under any distance measure defined by a polygonal unit shape; and means for accumulating a POF contribution of each face of the critical defect size map to form a piece-wise two-degree polynomial function representing the POF function.

A third aspect of the invention is related to a computer program product comprising a computer useable medium having computer readable program code embodied therein for determining a probability of fault (POF) function for an integrated circuit design, the program product comprising: program code configured to construct a critical defect size map based on a layout geometry of the integrated circuit design under any distance measure defined by a polygonal unit shape; and program code configured to accumulate a POF contribution of each face of the critical defect size map to form a piece-wise two-degree polynomial function representing the POF function.

A fourth aspect of the invention is directed to a method for determining a sampling of a probability of fault (POF) for an integrated circuit design layout, the method comprising the steps of: constructing a critical defect size map based on a layout geometry of the integrated circuit design under any distance measure defined by a polygonal unit shape; accumulating a convolved sampling of POF contributions of each face of the critical defect size map; and reconstructing an exact value of the POF at the sample points based on the accumulated convolutions.

A fifth aspect of the invention is related to a system for determining a sampling of a probability of fault (POF) for an integrated circuit design layout, the system comprising: means for constructing a critical defect size map based on a layout geometry of the integrated circuit design under any distance measure defined by a polygonal unit shape; means for accumulating a convolved sampling of POF contributions of each critical defect size map face; and means for reconstructing an exact value of the POF at the sample points based on the accumulated convolutions.

A sixth aspect of the invention is related to a program product stored on a computer readable medium for determining a sampling of a probability of fault (POF) for an integrated circuit design layout, the computer readable medium comprising program code for performing the following steps: constructing a critical defect size map based on a layout geometry of the integrated circuit design under any distance measure defined by a polygonal unit shape; accumulating a convolved sampling of POF contributions of each critical defect size map face; and reconstructing an exact value of the POF at the sample points based on the accumulated convolutions.

The foregoing and other features of the invention will be apparent from the following more particular description of embodiments of the invention.

BRIEF DESCRIPTION OF THE DRAWINGS

The embodiments of this invention will be described in detail, with reference to the following figures, wherein like designations denote like elements, and wherein.

DETAILED DESCRIPTION

The description includes the following headings for organizational purposes only: I. Overview of Critical Defect Size Maps; II. Probability of Fault (POF) Function Overview; III. System Overview; IV. Operational Methodology, A. Exact Probability of Fault Function Determination, B. Sampling of Probability of Fault Function Determination, and C. Computation Window Optional Embodiment; and V. Conclusion.

I. Overview of Critical Defect Size Maps

A "critical defect size map" is a diagram generated by any technique that maps critical defect sizes to each point in a design layout in a planar fashion. The invention will be described in terms of one technique, i.e., Voronoi diagrams, to generate a critical defect size map. It should be recognized, however, that other techniques may be possible. For example, another technique for generating critical defect size maps is to expand shapes by some defect size r. See, "Yield Estimation Based on Layout & Process Data," K. Subramanian, Master's Thesis Work University of Texas at Arlington, March, 2003. The resulting intersection of all expanded shapes are those regions in which the critical defect size is less than or equal to r, i.e., $\leq r$. The resulting intersections of the outline of all expanded shapes are those regions in which the critical defect size equals r. One can use this technique in order to obtain an estimated critical defect size map for the entire design.

As noted above, the invention implements a critical defect size map to determine a probability of fault (POF) function of an integrated circuit layout. When a Voronoi diagram is used, it may take a variety of forms depending on the structure to which it is applied. In the simplest example, referring to FIG. 1, a critical defect size map in the form of "Voronoi diagram" 8 for a set of sites (points) 10a-10d includes all points that are closer to a corresponding site, e.g., 10a, than to any other site 10b-10d. The resulting Voronoi diagram 8 includes a collection of regions 12a-12d, called "Voronoi cells," that divide up the plane in which sites 10a-10d sit, i.e., the plane of the page. Each Voronoi cell 12a-12d is in the shape of a convex polygon (for point sites only) having edges that are bisectors of sites 10a-10d. Each Voronoi cell 12a-12d corresponds to, or is owned by, one of sites 10a-10d. Again, all points in one cell, e.g., 12a, are closer to the corresponding site 10a than to any other site 10b-10d.

Figure 2A:
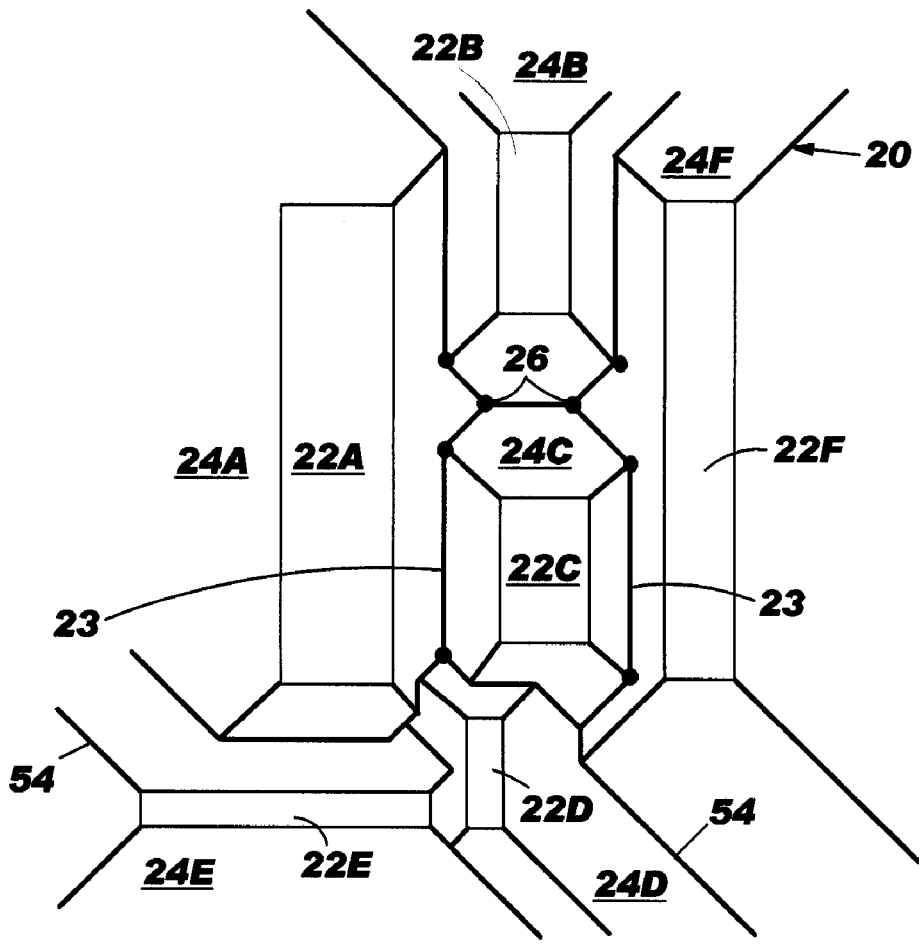
FIG. 2A shows an exterior critical defect size map (Voronoi diagram) for a set of polygons using the $L_\infty$ metric.
Figure 2B:
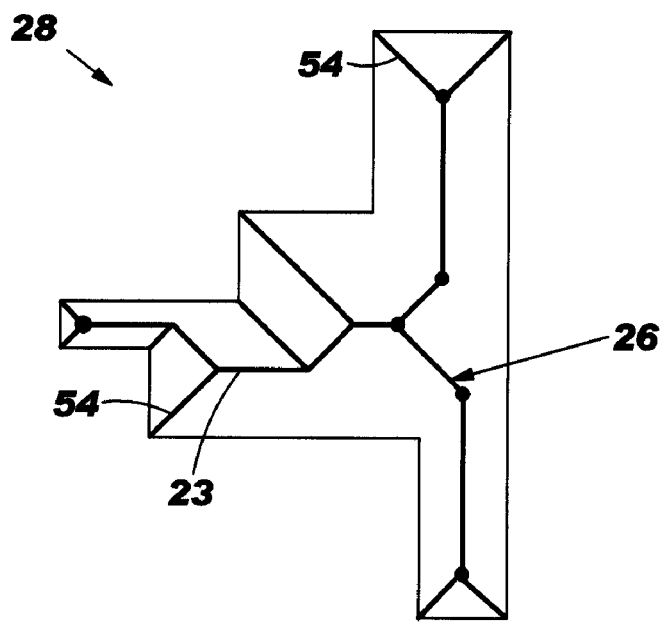
FIG. 2B shows an interior critical defect size map (Voronoi diagram) for a polygon using the $L_\infty$ metric.
Figure 3A:
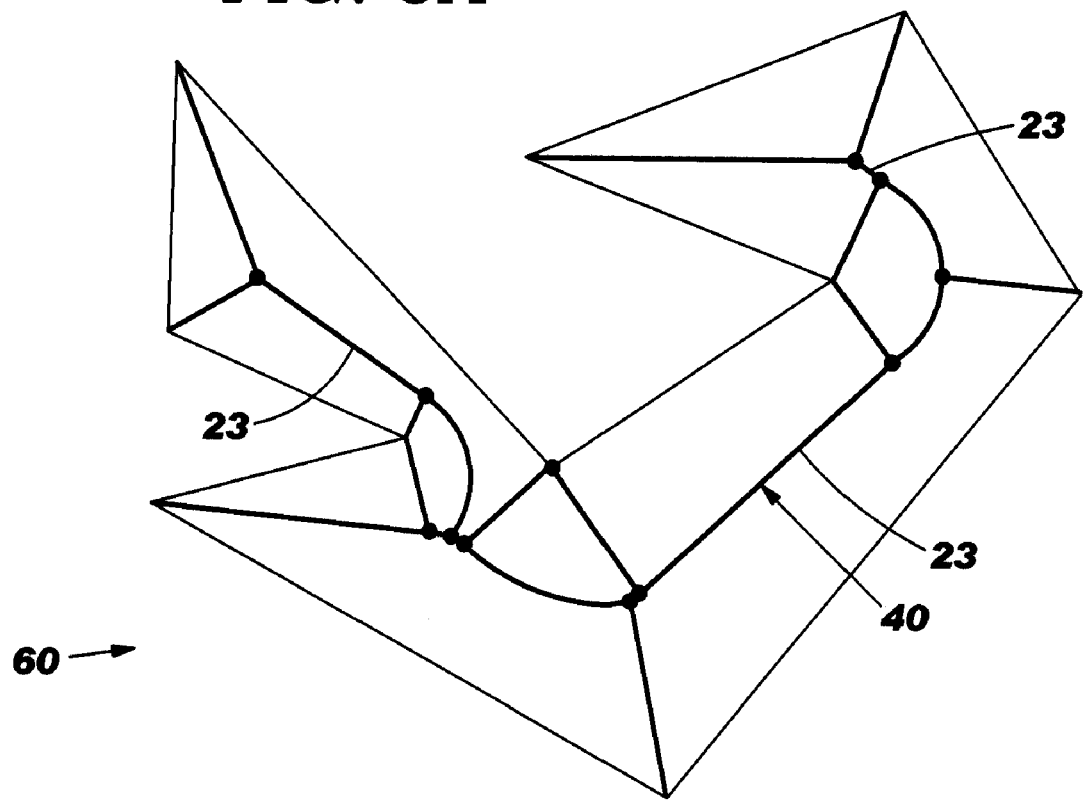
FIG. 3A shows an interior critical defect size map (Voronoi diagram) for an acute polygon using the Euclidean metric.
Figure 3B:
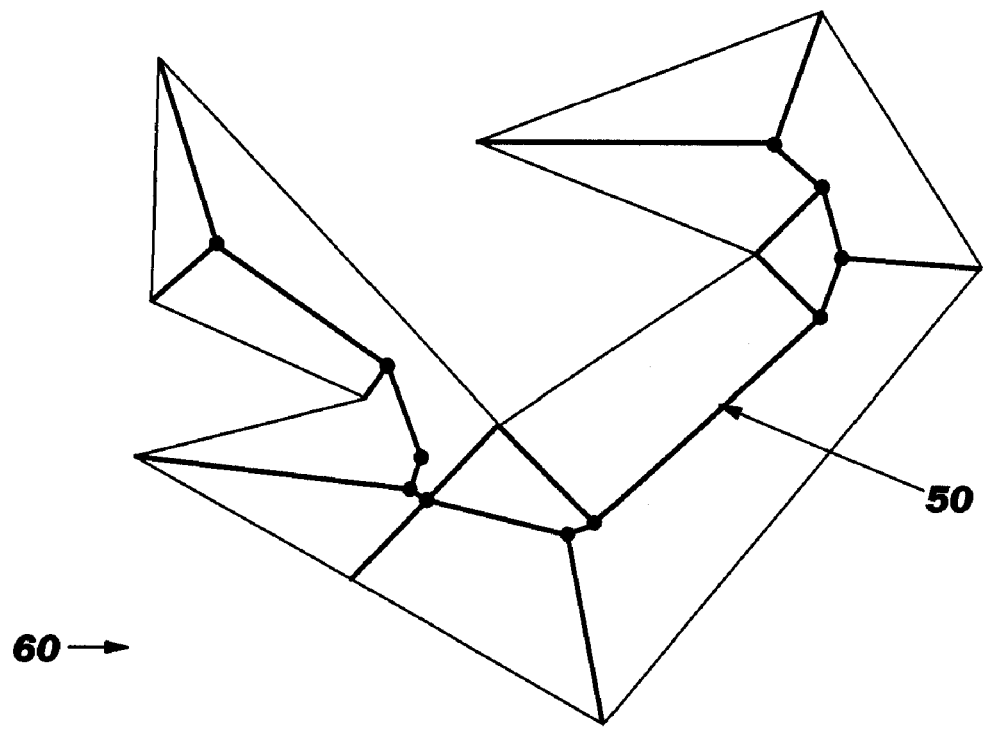
FIG. 3B shows an interior critical defect size map (Voronoi diagram) for the acute polygon of FIG. 3 using the $L_\infty$ metric.

FIGS. 2A-2B illustrate an exterior Voronoi diagram 20 and an interior Voronoi diagram 26 for orthogonal shapes, respectively. FIG. 2A illustrates a set of disjointed polygonal sites 22A-22F, and FIG. 2B illustrates a polygon 28. FIGS. 3A-B illustrate interior Voronoi diagrams 40, 50 for an acute polygon shape 60. As used herein, the term "boundary" shall refer to an outer border or line of a shape, while an "edge" shall refer to a component of the boundary.

As shown in FIG. 2A, an external Voronoi diagram 20 for a set of disjoined polygonal sites, i.e., polygons 22A-22F, includes a partitioning of the plane containing polygons 22A-22F into Voronoi cells, e.g., 24A-24F. Each Voronoi cell, e.g., 24A, for a polygon 22A includes a locus of points closer to polygon 22A than to any other polygon 22B-22F. That is, it includes bisectors 54 of adjacent polygons 22B-22F (others not shown). A Voronoi cell of a site s, e.g., polygon 22A, is denoted as reg(s) and polygon 22A is referred to as the owner of reg(s). A portion 23 of Voronoi diagram 20 that borders two Voronoi cells 24A and 24B is referred to as a "Voronoi edge," and includes portions of bisectors 54 between the owners of cells. A point 26 where three or more Voronoi edges 23 meet is called a "Voronoi vertex."

FIGS. 3A and 3B illustrate interior Voronoi diagrams 40, 50 for an acute polygon shape 60.

Referring to FIGS. 2B, 3A-3B, an interior Voronoi diagram 26, 40, 50 on an interior of a shape 60 (polygon 28 in FIG. 2B) is referred to as a "medial axis." Formally, the "medial axis" is the locus of points [q] internal to a polygon such that there are at least two points on the object's boundary that are equidistant from [q] and are closest to [q].

Figure 1:
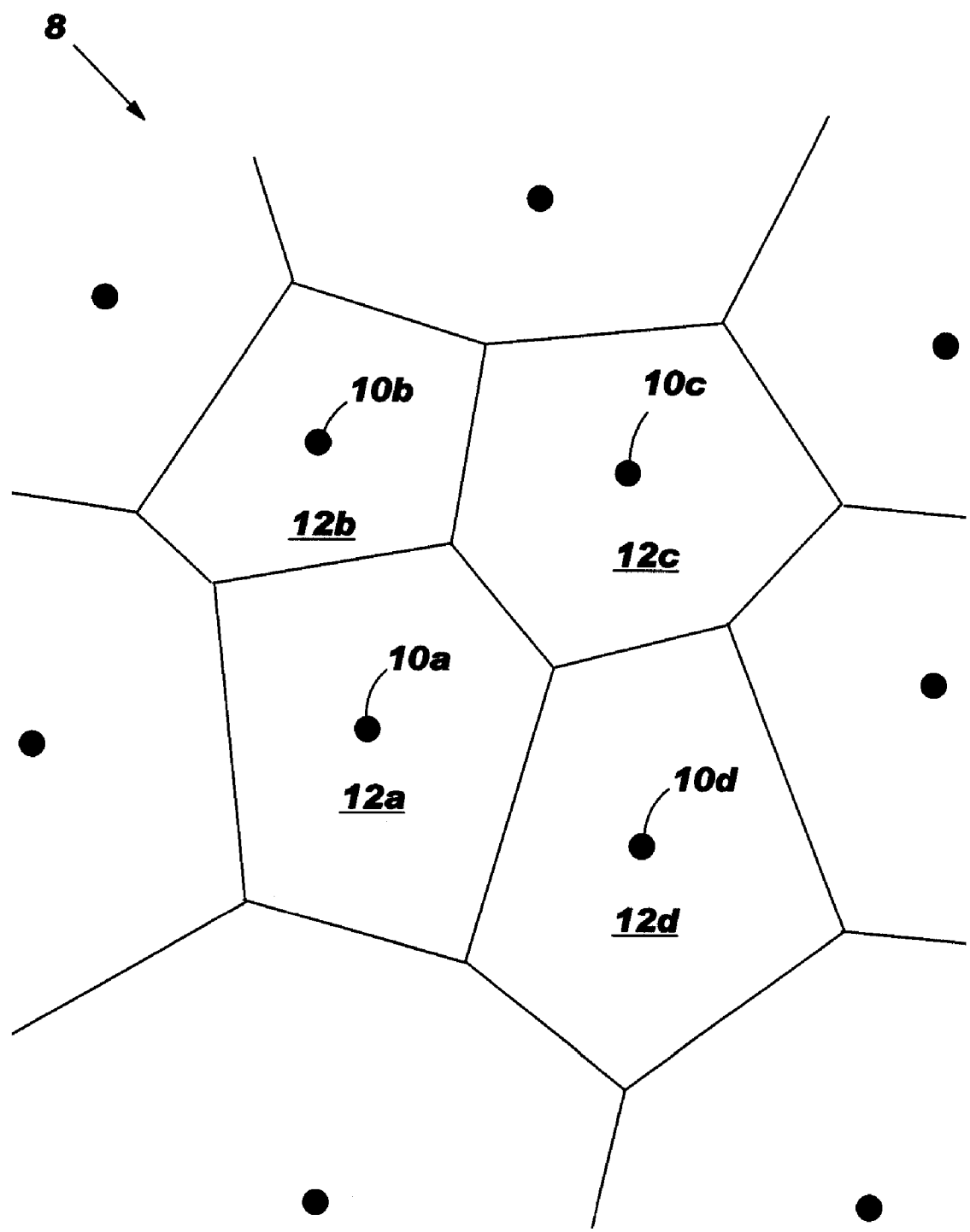
FIG. 1 shows a simplified example of a critical defect size map in the form of a Voronoi diagram.
Figure 4A:
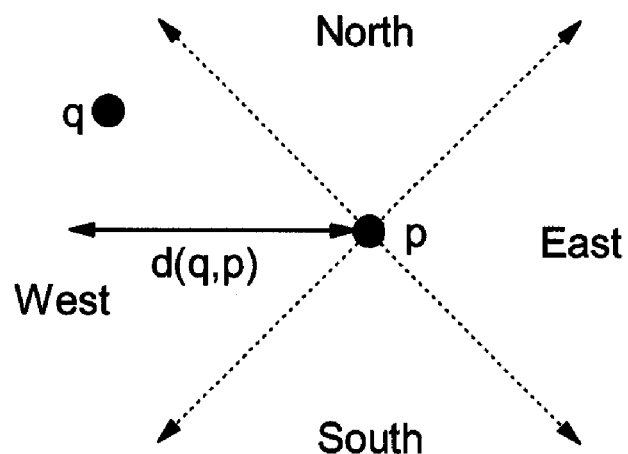
FIGS. 4A-4B show illustrations for description of the $L_\infty$ metric.
Figure 4B:
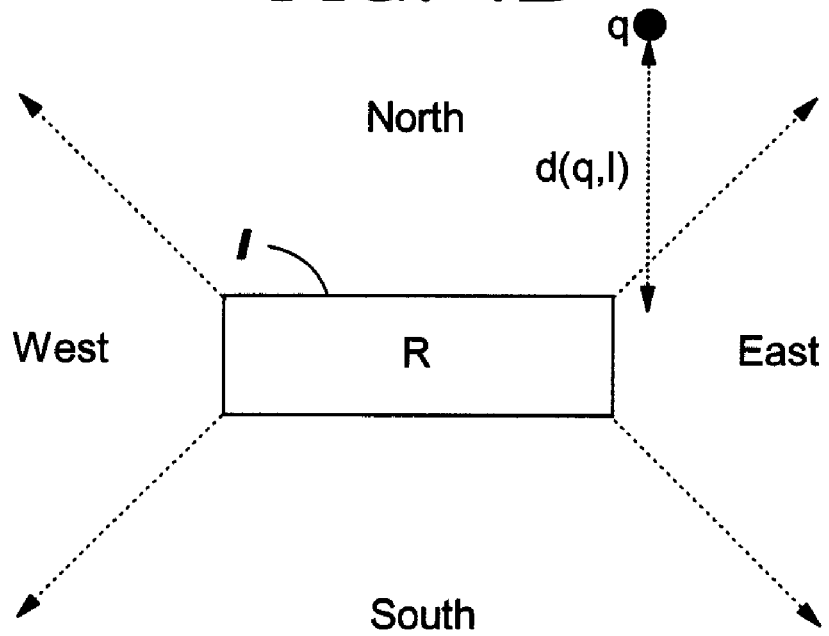

The above-described Voronoi diagrams of FIGS. 1 and 3A are illustrated as based on the Euclidean metric. That is, Voronoi distances are based on the Euclidean metric. The invention, as will be described further below, may also implement Voronoi diagrams based on an $L_\infty$ (L-infinity) metric. Referring to FIGS. 4A-4B, in the $L_\infty$ metric, the distance between two points (FIG. 4A) $p=(x_p, y_p)$ and $q=(x_q, y_q)$ is the maximum of the horizontal distance and the vertical distance between p and q, i.e., $d(p,q)=\max$ $$[|x_p-x_q|, |y_p-y_q|].$$

Intuitively, the $L_\infty$ distance is the size of the smallest square touching p and q. The $L_\infty$ distance between any two points is less than or equal to the Euclidean distance between the points. Further, in the $L_\infty$ metric, the distance between a point p and a line l (FIG. 4B) is $d(p,l)=\min$ $$[d(p,q), \forall q \in l].$$

The $L_\infty$ bisector of two polygonal elements (points or lines) is the locus of points at equal $L_\infty$ distance from the two elements.

Returning to FIG. 3B, medial axis 50 of shape 60 is illustrated as based on the $L_\infty$ metric. (Medial axis 28 in FIG. 2B is also based on the $L_\infty$ metric). As easily discerned by comparing FIGS. 3A-3B, the use of the $L_\infty$ metric simplifies Voronoi diagram 50 of polygonal objects and makes it simpler to compute. The $L_\infty$ Voronoi diagrams are a "skeleton" of straight-line segments having linear combinational complexity. It should be recognized that the concepts and functioning of the invention are the same regardless of the metric used, and the invention should not be limited to any particular metric.

Each point, including vertices, on a Voronoi diagram includes a "weight" representing its distance to a shape. A Voronoi diagram, hence, maps all points (x, y) for a layout to the critical defect size (the size of the smallest defect landing at that point that would cause an electrical fault, i.e., a short between shapes (exterior Voronoi) or an open within a shape (interior Voronoi)). It is in this fashion that the Voronoi diagram provides a critical defect size map. Defects modeled using any distance measure defined by a polygonal unit shape (including the $L_\infty$ metric) results in this mapping being a piece-wise planar function.

Further explanation of Voronoi diagrams and their application to critical area determination can be found in U.S. Pat. Nos. 6,317,859 and 6,178,539, which are hereby incorporated by reference for all purposes. See also, E. Papadopoulou et al., "The $L_\infty$ Voronoi Diagram of Segments and VLSI Applications," International Journal of Computational Geometry and Applications, Vol. 11, No. 5, 2001, 503-528.

II. Probability of Fault (POF) Function Overview

A POF function is a measure of the probability that a random defect of a given size r landing on the IC design will cause an electrical fault in the circuit. The POF function is dependent on the IC design, and is also useful for determining random defect failure probabilities for various manufacturing process models. Similar to critical area, a POF function includes integration over the area of an IC design. As will be described below, an IC design can be partitioned, and the POF contribution within each partition, can be determined and summed to obtain the POF function of the entire IC design. A critical defect size map (Voronoi diagram) face includes all of the information necessary to determine its POF function contribution. Triangular decomposition of the critical defect size map (Voronoi diagram) face and determination of the POF function contribution of each triangle can also be made. In this case, counter-clockwise triangles denote additive POF contributions, and clock-wise triangles denote subtractive POF contributions.

III. System Overview

Figure 5:
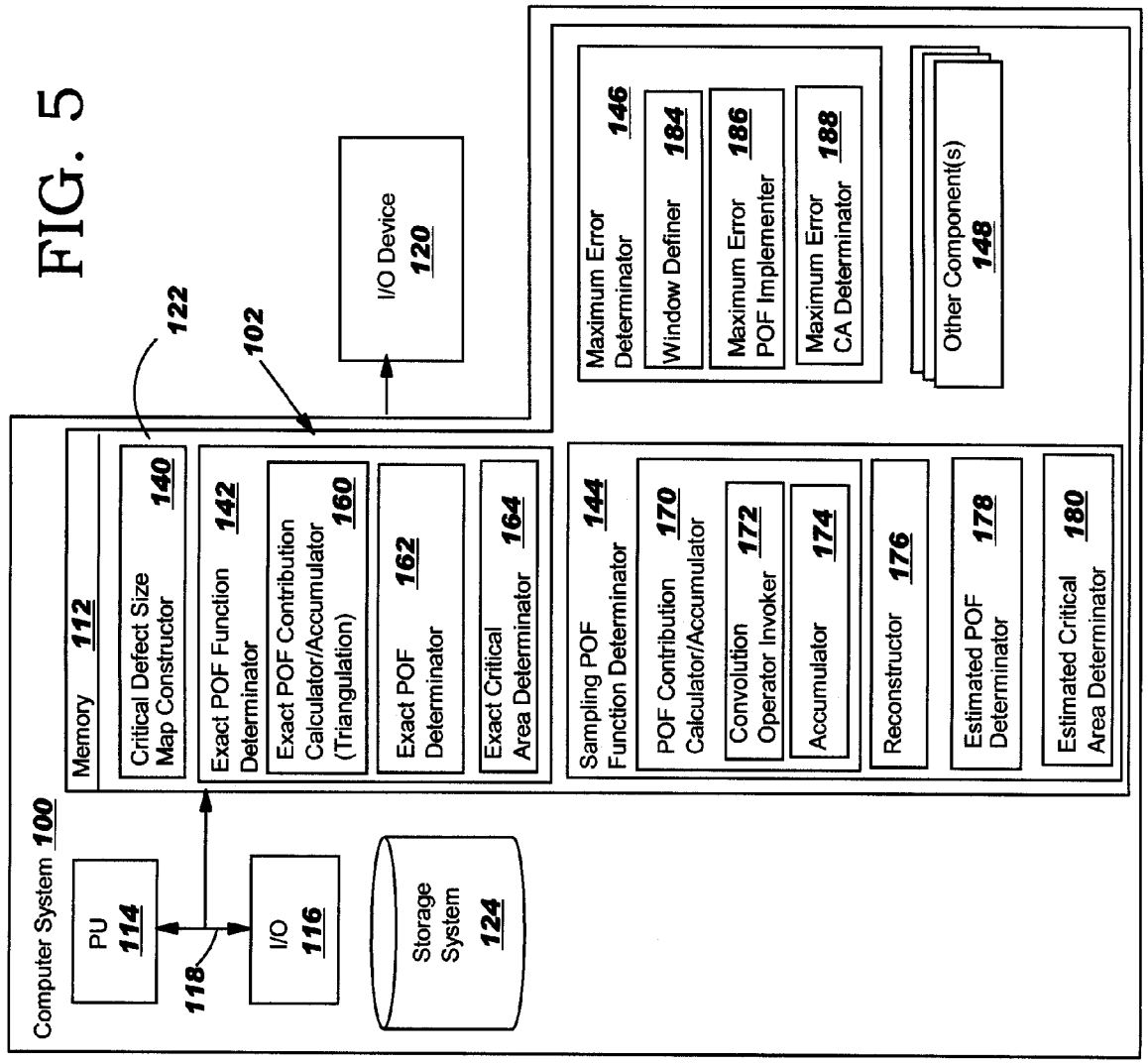
FIG. 5 shows a block diagram of a probability of fault (POF) function determining system according to the invention.

With reference to the accompanying drawings, FIG. 5 is a block diagram of a computer system 100 including a POF system 102 for, inter alia, determining a POF function in accordance with the invention. POF system 102 is shown implemented on computer system 100 as computer program code 122. To this extent, computer system 100 is shown including a memory 112, a processing unit (PU) 114, an input/output (I/O) interface 116, and a bus 118. Further, computer system 100 is shown in communication with an external I/O device/resource 120 and a storage system 124. In general, processing unit 114 executes computer program code, such as system 102, that is stored in memory 112 and/or storage system 124. While executing computer program code, processing unit 114 can read and/or write data to/from memory 112, storage system 124, and/or I/O device 120. Bus 118 provides a communication link between each of the components in computer system 100, and I/O device 120 can comprise any device that enables user to interact with computer system 100 (e.g., keyboard, pointing device, display, etc.).

Alternatively, a user can interact with another computing device (not shown) in communication with computer system 100. In this case, I/O interface 116 can comprise any device that enables computer system 100 to communicate with one or more other computing devices over a network (e.g., a network system, network adapter, I/O port, modem, etc.). The network can comprise any combination of various types of communications links. For example, the network can comprise addressable connections that may utilize any combination of wireline and/or wireless transmission methods. In this instance, the computing devices (e.g., computer system 100) may utilize conventional network connectivity, such as Token Ring, Ethernet, WiFi or other conventional communications standards. Further, the network can comprise one or more of any type of network, including the Internet, a wide area network (WAN), a local area network (LAN), a virtual private network (VPN), etc. Where communications occur via the Internet, connectivity could be provided by conventional TCP/IP sockets-based protocol, and a computing device could utilize an Internet service provider to establish connectivity to the Internet.

Computer system 100 is only representative of various possible combinations of hardware and software. For example, processing unit 114 may comprise a single processing unit, or be distributed across one or more processing units in one or more locations, e.g., on a client and server. Similarly, memory 112 and/or storage system 124 may reside at one or more physical locations. Memory 112 and/or storage system 124 can comprise any combination of various types of computer-readable media and/or transmission media including magnetic media, optical media, random access memory (RAM), read only memory (ROM), a data object, etc. I/O interface 116 can comprise any system for exchanging information with one or more I/O devices. Further, it is understood that one or more additional components (e.g., system software, math co-processing unit, etc.) not shown in FIG. 5 can be included in computer system 100. To this extent, computer system 100 can comprise any type of computing device such as a network server, a desktop computer, a laptop, a handheld device, a mobile phone, a pager, a personal data assistant, etc. However, if computer system 100 comprises a handheld device or the like, it is understood that one or more I/O devices (e.g., a display) and/or storage system 124 could be contained within computer system 100, not externally as shown.

As discussed further below, POF system 102 is shown including a critical defect size map constructor 140; an exact POF function determinator 142; a sampling POF function determinator 144; a maximum error determinator 146 and other system components 148. Exact POF function determinator 142 includes an exact POF contribution calculator/accumulator 160, an exact POF determinator 162, and an exact critical area determinator 164. Sampling POF function determinator 144 includes a POF contribution calculator/accumulator 170 having a convolution operator invoker 172 and accumulator 174; a reconstructor 176; an estimated critical area determinator 178 and an estimated POF determinator 180. Maximum error determinator 146 includes a window definer 184, a maximum error POF implementer 186 and a maximum error critical area (CA) determinator 188. Other system components 146 may include any other function necessary for operation of the invention, but not explicitly described herein.

IV. Operational Methodology

Turning to FIGS. 6-14, along with FIG. 5, operational methodology of the invention will now be described.

A. Exact Probability of Fault Function Determination

Figure 6:
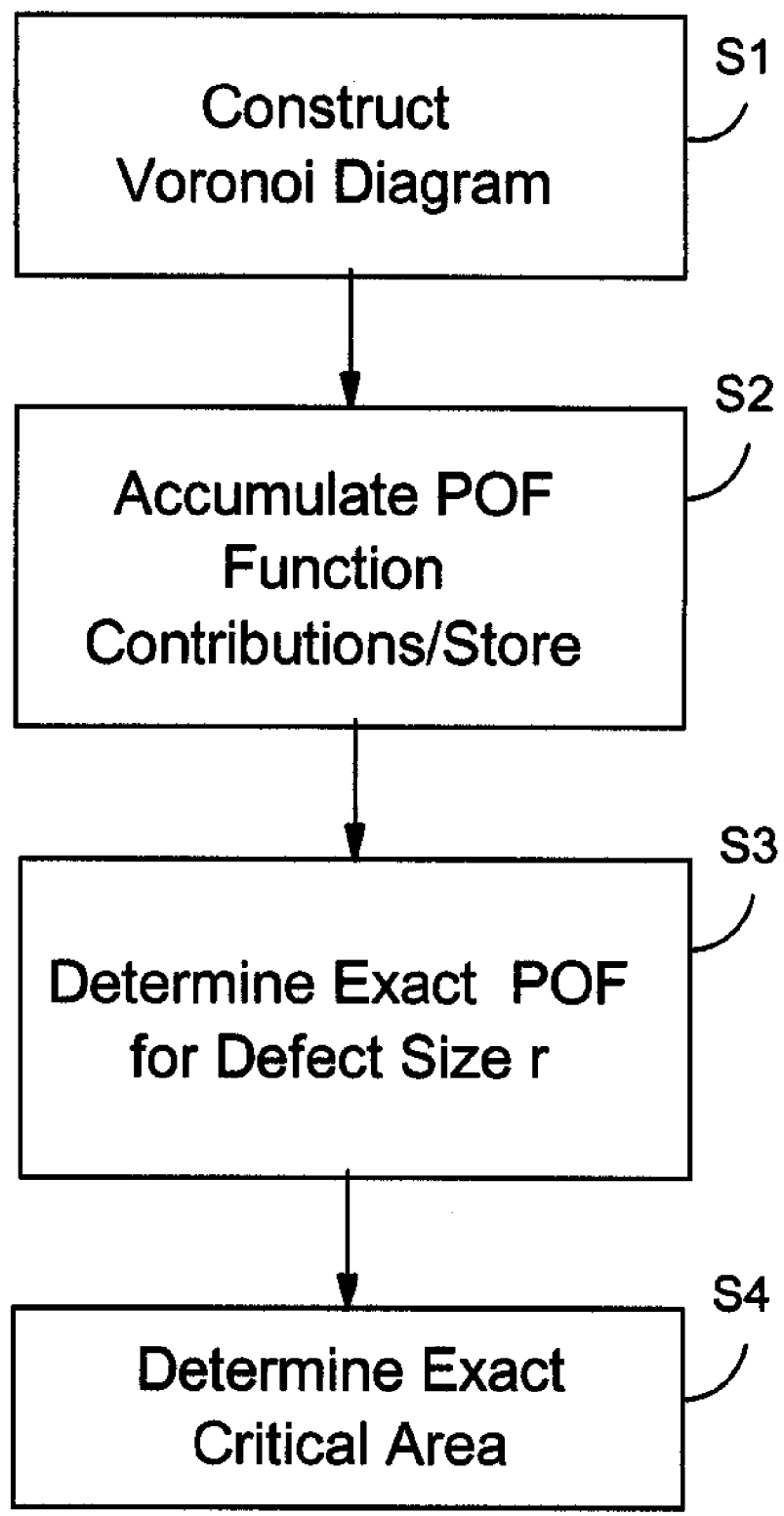
FIG. 6 shows a flow diagram of operation of the system of FIG. 5 according to a first embodiment of the invention.

FIG. 6 shows a flow diagram of the methodology of determining a POF function of an integrated circuit design, which will be described in conjunction with FIG. 5, according to a first embodiment of the invention. In particular, in a first step S1, a critical defect size map (e.g., Voronoi diagram) is constructed by critical defect size map constructor 140 based on a layout geometry under any distance measure defined by a polygonal unit shape. See FIGS. 2A, 2B, 3A, 3B. In one embodiment, the $L_\infty$ metric is used, which is defined by a circumscribed square. However, other metrics may also be implemented such as the Manhattan Metric, which uses a unit shape in the form of a diamond inscribed in the unit circle. Other polygons can be used besides the diamond and square to describe an appropriate metric. The unit shape has to be a polygon to guarantee that critical defect size map (Voronoi diagram) faces are planar polygons. Otherwise, the equations herein would not work. The critical defect size map (Voronoi diagram) partitions the layout into faces represented by planar polygons and assigns a weight to each vertex. The map is modeled based on an evaluation for opens or shorts, individually.

Figure 7:
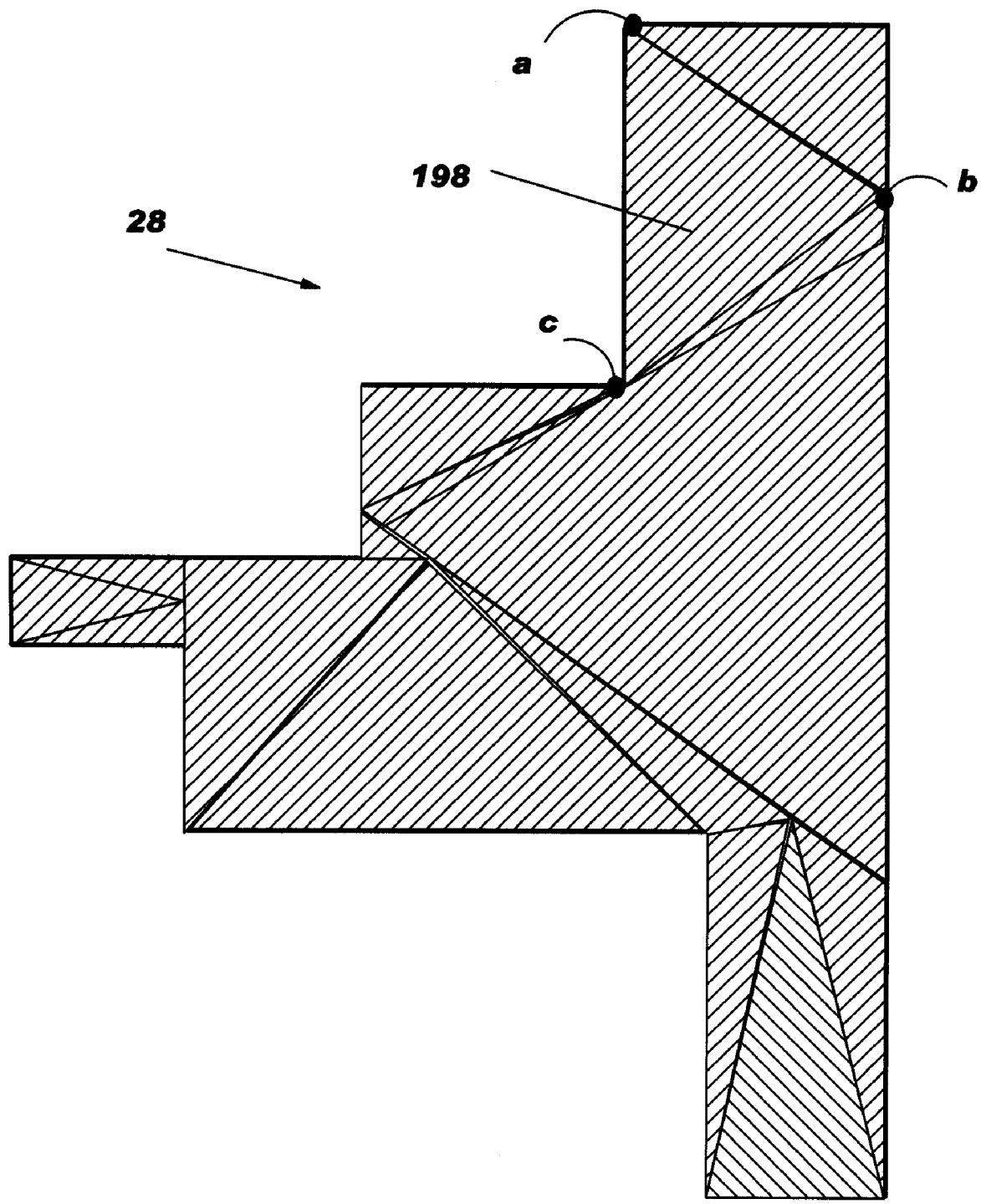
FIG. 7 shows a triangular decomposition of the shape from FIG. 2B.

In a second step S2, (exact) POF function contributions of each face of the critical defect size map are accumulated by exact POF contribution calculator/accumulator 160 of exact POF function determinator 142. This step is carried out using a triangular decomposition technique that is similar in fashion to calculating an area of a polygon in which areas of the triangles sum to determine the area of the polygon. FIG. 7 shows polygon shape 28 from FIG. 2B triangulated in one fashion. Each triangle 198 may be defined by vertices a, b and c (only one shown with vertices a, b, c). It should be recognized that FIG. 7 is a simplified rendition of a triangular decomposition because it does not depict the most general case where triangular regions can have positive or negative contributions. In general any triangular decomposition technique can be used. The POF function contribution for each triangle is determined by POF contribution calculator/accumulator 160, according to:

$$POF(r) = \frac{TriangleArea}{TotalChipArea} * (Vcont(a.z, b.z, c.z, r) + Vcont(b.z, c.z, a.z, r) + Vcont(c.z, a.z, b.z, r))$$

where POF(r) is the probability of fault for a defect of particular size r; Vcont values are a contribution of the vertices a, b, c of the triangle to critical area; a.z, b.z and c.z are the critical defect size map weights at for vertices a, b and c, respectively.

The way in which each vertex contributes to critical area is given by:

$$Vcont(i, j, k, r) = \begin{cases} 0 & r \in [0, i] \\ \frac{(r-i)^2}{(j-i)(k-i)} & (i \neq j) \wedge (i \neq k) \wedge r \in [i, \infty) \\ \frac{1}{2}\left(1 - \left(\frac{r-k}{i-k}\right)^2\right) & (i = j) \wedge (i \neq k) \wedge r \in [i, \infty) \\ \frac{1}{2}\left(1 - \left(\frac{r-j}{i-j}\right)^2\right) & (i \neq j) \wedge (i = k) \wedge r \in [i, \infty) \\ \frac{1}{3} & (i = j) \wedge (i = k) \wedge r \in [i, \infty) \end{cases}$$

Where i, j and k are the vertices' critical defect size map weights of a triangle. Accordingly, the POF contribution of each vertex a, b, c is based on four variables: the three critical defect size map weights for each vertex of a triangle 198 (FIG. 7) and the particular defect size r.

For each triangle, the POF function reduces to a constant, such as 0, ½ or ⅓ or some other number, or it reduces to a second-degree polynomial function based on defect size r. As each triangle 198 is analyzed for a decomposed polygon shape of the IC design (see FIG. 7), it results in a series of values or second-degree polynomials based on defect size r for each piece. Note, the values are still second-degree polynomials. In particular, the POF function contributions can be piece-wise defined depending on whether i=j, i=k and the value of defect size r. Since each polynomial is of the same degree, they can be sequenced together piece-wise, resulting in a piece-wise two-degree polynomial representing the final POF function. Because it is a piece-wise two-degree polynomial, the final POF function includes boundary points at which the polynomial changes.

The following example illustrates the summation of three two-degree polynomials in a piece-wise manner involving a triangle with vertex weights 5, 5, and 2 units.

$$Vcont(5, 5, 2, r) = \begin{cases} 0 & r \in [0, 5] \\ -\frac{1}{6}r^2 + \frac{2}{3}r - \frac{1}{6} & r \in [5, \infty) \end{cases}$$

$$Vcont(2, 5, 5, r) = \begin{cases} 0 & r \in [0, 2] \\ \frac{1}{9}r^2 - \frac{4}{9}r + \frac{4}{9} & r \in [2, \infty) \end{cases}$$

$$Vcont(5, 2, 5, r) = \begin{cases} 0 & r \in [0, 5] \\ -\frac{1}{6}r^2 + \frac{2}{3}r - \frac{1}{6} & r \in [5, \infty) \end{cases}$$

$$Vcont(5, 5, 2, r) + Vcont(2, 5, 5, r) + Vcont(5, 2, 5, r) =$$

$$\begin{cases} 0 & r \in [0, 2] \\ \frac{1}{9}r^2 - \frac{4}{9}r + \frac{4}{9} & r \in [5, 2] \\ -\frac{2}{9}r^2 + \frac{8}{9}r + \frac{1}{9} & r \in [5, \infty) \end{cases}$$

Note that the resulting sum has 3 intervals for r bounded at 2 units and 5 units. These boundaries correspond to the weights in the triangle. The equation within each interval also remains at most degree-two.

As part of step S2, a complete POF function is stored as a piece-wise defined two-degree polynomial. That is, a complete POF function including each piece-wise defined two-degree polynomial accumulated in step S2 is stored for use in determining an exact POF for a particular defect size r according to the above-described equation. Defect size r is the only unknown in the POF function because the area of each triangle, total chip area, and critical defect size map weights a.z, b.z, c.z for each triangle are known.

As an optional step S3, an actual POF can be computed using the POF function stored in step S2 based on a particular defect size r. Computations may also be conducted for each possible defect size r.

As another optional step S4, an exact critical area of the IC design can be determined in a conventional fashion by integrating a product of the POF function with a defect density function. In particular, the following equation can be employed to determine an exact critical area:

$$\Theta = \frac{CriticalArea}{AreaOfLayout} = \int_0^\infty POF(r) DefectDensity(r) dr$$

B. Sampling of Probability of Fault Function Determination

In a worst-case scenario, a two-degree polynomial for each vertex of the critical defect size map may be required, which requires a relatively vast amount of storage. As a result, although unlikely, calculations (storage) may number as many as unique vertex weights in the critical defect size map, and storage requirements may become cumbersome. Where the first embodiment of the invention is considered too computationally complex and storage-wise overburdening, a second embodiment of the invention may be implemented. In this embodiment of the invention, a sampling of a probability of fault (POF) function at intervals is used for an IC design layout.

Figure 8:
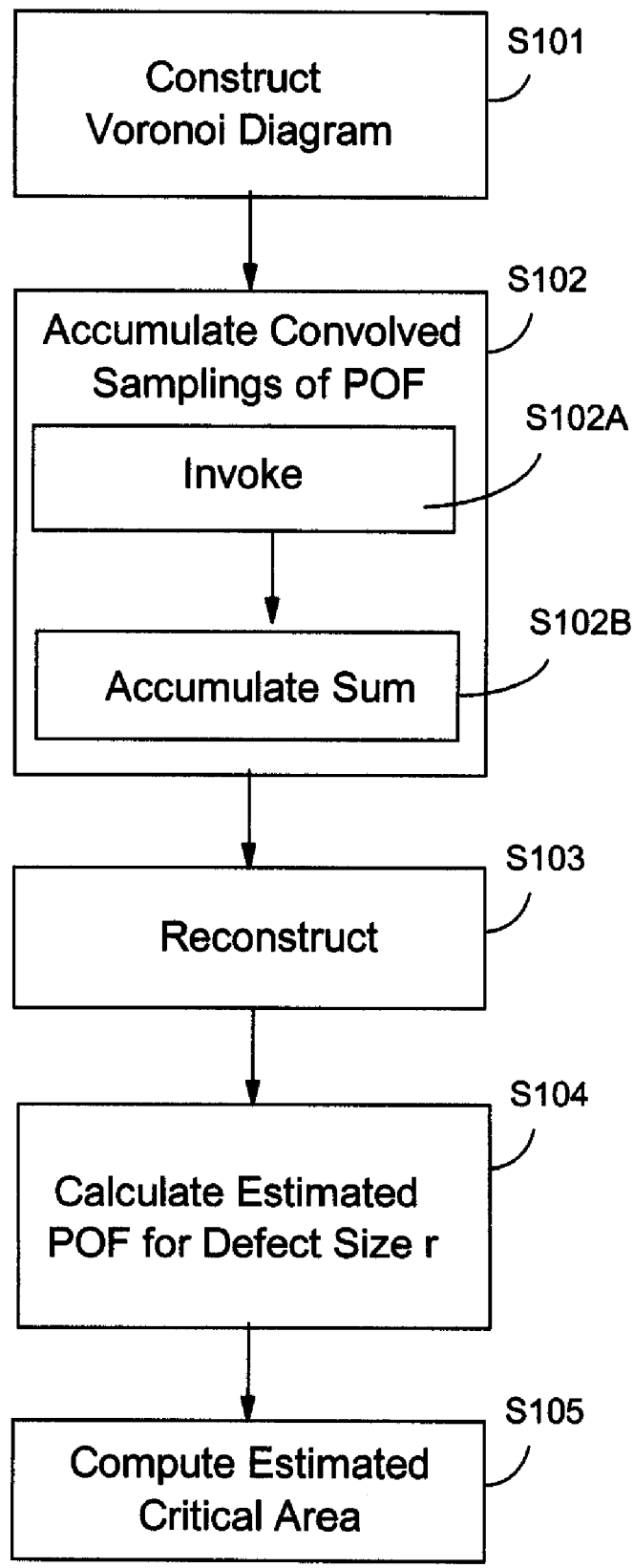
FIG. 8 shows a flow diagram of operation of the system of FIG. 5 according to a second embodiment of the invention.

Turning to FIG. 8, a first step S101 of this embodiment includes constructing a critical defect size map using critical defect size map constructor 140 based on a layout geometry of the integrated circuit design under any distance measure defined by a polygonal unit shape. This step is substantially similar to step S1 of FIG. 6, described above.

Figure 9:
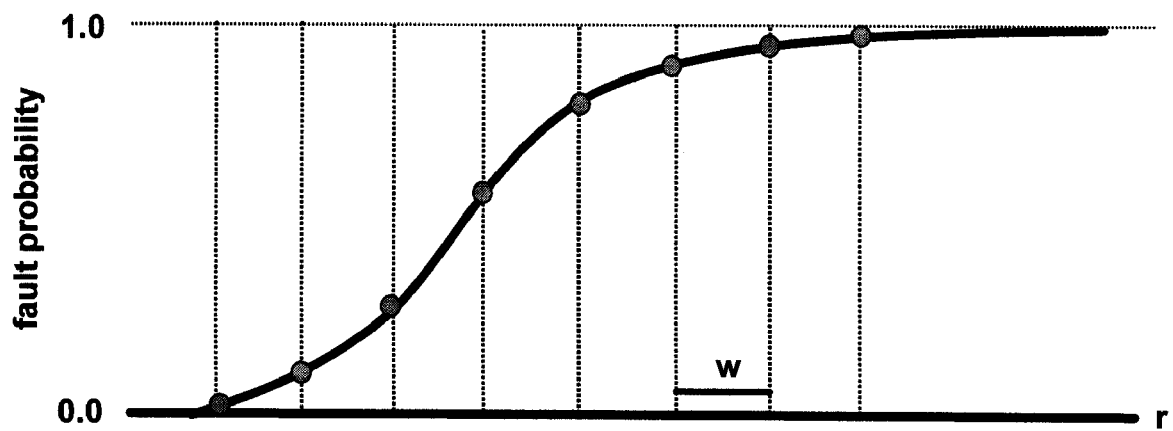
FIG. 9 shows a graph of POF versus defect size with regular sampling intervals.

In a second step S102, a convolved sampling of POF contributions of each critical defect size map (Voronoi diagram) triangle is (calculated and) accumulated by POF contribution calculator/accumulator 170. This is in contrast to the first embodiment in which the exact POF contribution of each critical defect size map (Voronoi diagram) triangle was calculated and accumulated. In a first sub-step S102A, a convolution operator is invoked by convolution operator invoker 172 to convolve the POF function of each triangle to a form independent of defect size r. Each sampling point has the same value as in the exact POF. FIG. 9 shows a graph of the POF function versus defect size r with regular sampling intervals w starting at r=0. The time complexity of this embodiment is O(N log N+p), where N is the number of shapes, p is the number of samples at sampling intervals w starting at r=0.

To achieve the convolved sampling, the convolution operator of degree-n is defined as:

$$C^n(F, x) = \sum_{i=0}^{n} (-1)^n \binom{n}{i} F\left(x + \frac{n-i}{2}w\right)$$

where $C^n$ (F, x) is the convolution operator, n is the order of the convolution (total number of convolutions necessary), F represents any polynomial function, x is the sampling point (i.e., x value along x axis for a particular sample of the function-FIG. 9), i is the iteration number, and w is the size of the sampling interval.

An identity, differential property and additive property for the convolution operator are defined as follows:

Identity: $C^0$ (F,x)=F(x), where $C^0$ (F, x) is the convolution of function F when n=0, x is the sampling point and F(x) is the function of x.

Differential Property:

$$C^n(F, x) = C^{n-1}\left(F, x + \frac{1}{2}w\right) - C^{n-1}\left(F, x - \frac{1}{2}w\right),$$

where $C^n$(F,x) is the convolution function, F is the function, x is the sampling point, and w is size of the interval.

Additive Property:

$$C^n\left(\sum_i F_i, x\right) = \sum_i C^n(F_i, x)$$

Where $$C^n\left(\sum_i F_i, x\right)$$

is the convolution of a sum of polynomials $F_i$, and $$\sum_i C^n(F_i, x)$$

is the sum of the convolution of polynomials $F_i$.

For first sub-step S102A, the convolution operator in the form of $C^3$ (POF, r) is invoked by convolution operator invoker 172 to convolve the POF function of each triangle and for every sample defect size r. That is, n=3, F=POF, and x=sampling point defect size r value in the convolution operator, resulting in:

$$C^3(POF, r) = \sum_{i=0}^{3} (-1)^3 \binom{3}{i} POF\left(r + \frac{3-i}{2}w\right).$$

One advantageous property is that $C^3$ (POF, r)=0 unless r is within 3 sample intervals w of each of the weights of vertices of the triangle.

Figure 10:
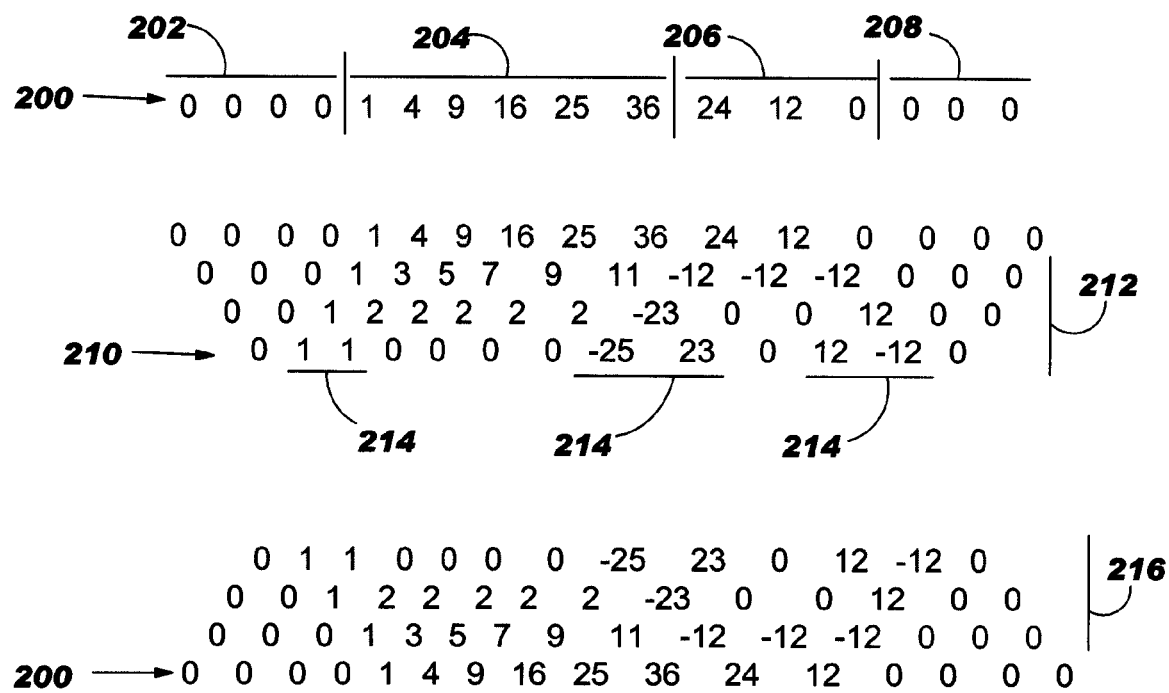
FIG. 10 shows reduction and reconstruction of a second-degree polynomial function in the form of a series of numbers.

To elaborate on operation of the convolution operator, FIG. 10 illustrates a piece-wise defined second-degree polynomial function 200 as a sequence of values. The vertical lines indicate boundaries for the different pieces of the polynomial function, i.e., points at which the second-degree polynomial changes. Boundaries indicate a sampling point for the POF function, i.e., where r=the critical defect size map weight of a vertex of a triangle. A first piece 202 indicates a flat second-degree polynomial (i.e., 0), second piece 204 indicates a second-degree polynomial (i.e., $X^2$: $1^2(1)$, $2^2(4)$, $3^2(9)$, $4^2(16)$, $5^2(25)$, $6^2(36)$), third piece 206 indicate a second degree polynomial in which the first component is zero (e.g., a function of −12: 36−12(24), 24−12 (12), 12−12(0), and a fourth piece 208 indicates another flat second-degree polynomial (i.e., 0).

FIG. 10 also shows how the second-degree polynomial function 200 is reduced through the convolution operator to a reduced sequence 210 of values, which includes values at or surrounding a sampling point, and zeroes. It is this capability that allows the second embodiment to reduce the storage requirements for the POF function compared to the first embodiment. In particular, three rounds 212 (polynomial degree +1) of differencing consecutive values (i.e., convolving) results in reduced sequence 210 in which the number of non-zero grouped values is linearly proportional to the number of piece-wise boundaries of the original second-degree polynomial function 200. That is, each group of numbers 214 in reduced sequence 210 indicates a boundary (i.e., sampling point) in polynomial function 200. The above-described reduced sequence 210 allows for easier storage of second-degree polynomial function 200.

Returning to FIG. 8, in a second sub-step S102B, the sum of the convolution operator $C^3$ (POF, r) from all triangles in the critical defect size map m are accumulated by accumulator 174. Only those portions of each reduced sequence 210, representing sampling point vicinities, require summing. (i.e., where r=the critical defect size map (Voronoi diagram) weights at the vertices of the triangle and $C^3$(POF, r) is not zero). As a result, the computational complexity of this embodiment is reduced compared to the first embodiment.

In a third step S103, an exact value of the POF at the sample points is reconstructed by reconstructor 176 based on the accumulated convolutions using the differential property of the convolution operator. That is, based on the accumulated convolutions represented by a reduced sequence 210, the piece-wise second-degree polynomial function 200 can be reconstructed. Here, the differential property equation:

$$C^n(F, x) = C^{n-1}\left(F, x + \frac{1}{2}w\right) - C^{n-1}\left(F, x - \frac{1}{2}w\right),$$

is employed to reconstruct a piece-wise second degree polynomial function representative of the sampling of the POF function at each sampling point from the accumulated convolutions in step S102B. Here again, the order n=3, function F=POF, sampling point x=r, and w is the sampling interval size, resulting in:

$$C^3(POF, r) = C^2\left(POF, r + \frac{1}{2}w\right) - C^2\left(POF, r - \frac{1}{2}w\right)$$

FIG. 10 also illustrates how reduced sequence 210 can be used to reconstruct second-degree polynomial function 200, e.g., upon being recalled for use, representative of the sampling of the POF function. In particular, by conducting three rounds 216 (polynomial degree +1) of summing consecutive values (i.e., using differential property), the second-degree polynomial function 200 returns with the identical values at each sampling point.

Returning to FIG. 8, as an optional step, S104, an estimated POF can be computed by estimated POF determinator 178 using the sampling of the POF function based on a particular defect size r. Given the sampled points, one can use a number of interpolation techniques, such as linear and quadratic interpolation, to approximate the values in between. As a property, the POF function is 0 at defect size r=0 and monotonically increases, as r increases, up to a maximum value of 1 (probability). Thus interpolated values are restricted to remain between values of the adjacent samples. Computations may also be conducted for each possible defect size r.

As another optional step S105, an estimated critical area of the IC design can be determined by estimated critical area determinator 180 in a conventional fashion by integrating a product of the POF function with a defect density function. An estimation of critical area is all that is possible because not all of the POF function values are known. In particular, the following equation can be employed to determine an estimated critical area:

$$\Theta = \frac{CriticalArea}{AreaOfLayout} = \int_0^\infty POF(r) DefectDensity(r) dr$$

Irregular Sampling Intervals

Figure 11:
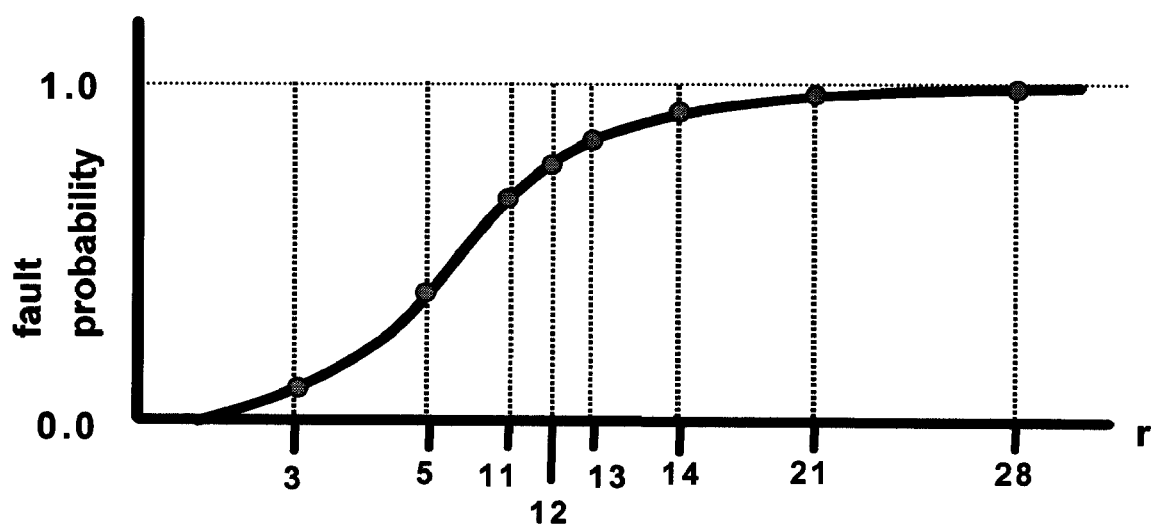
FIG. 11 shows a graph of POF versus defect size with irregular sampling intervals.

The above-described methodology can also be employed using irregular sampling intervals w by convolution operator invoker 172 defining sampling points x by some sampling polynomial function G(r) of degree g. FIG. 11 shows a graph of the POF function versus defect size r with varied sized sampling intervals, e.g., where sampling points x are defined by polynomial function $G(r)=(r-12)^2$. In this case, step S102A includes invoking the convolution operator $C^{2g+1}$ (POF, G(r)) to convolve the POF of a triangle to a form independent of defect size r. That is, the order of the convolution is 2g+1 and polynomial function G(r) is substituted for defect size r, such that the convolution operator is:

$$C^{2g+1}(POF, G(r)) = \sum_{i=0}^{2g+1} (-1)^{2g\_+1} \binom{2g+1}{i} POF\left(G(r) + \frac{2g+1-i}{2}w\right)$$

Where sampling polynomial function G(r) has a degree greater than one, additional convolutions may be necessary. For example, where degree g is 2, then at most five convolutions may be necessary, i.e., n=2g+1=5. Second sub-step S102B includes accumulating the sum of the convolution operator $C^{2g+1}$ (POF, G(r)) from all triangles in the critical defect size map. Step S103 is identical to that described above, except that additional cycles would be necessary where degree g is greater than one. That is, differential property of the convolution operator would be:

$$C^{2g+1}(POF, G(r)) = C^{2g}\left(POF, G(r) + \frac{1}{2}w\right) - C^{2g}\left(POF, G(r) - \frac{1}{2}w\right)$$

C. Computation Window Optional Embodiment

Figure 12:
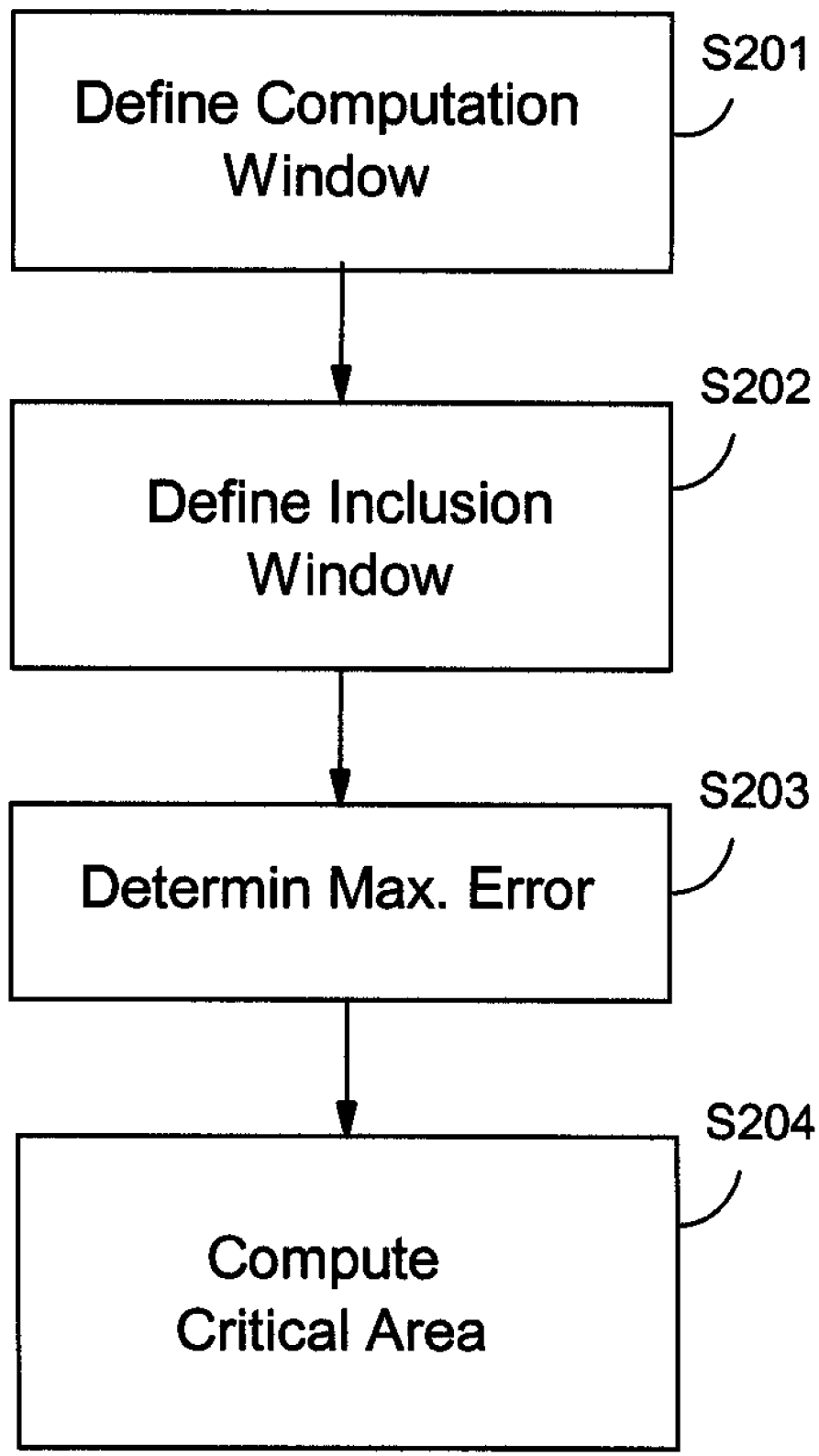
FIG. 12 shows a flow diagram of an optional embodiment of the invention.
Figure 13:
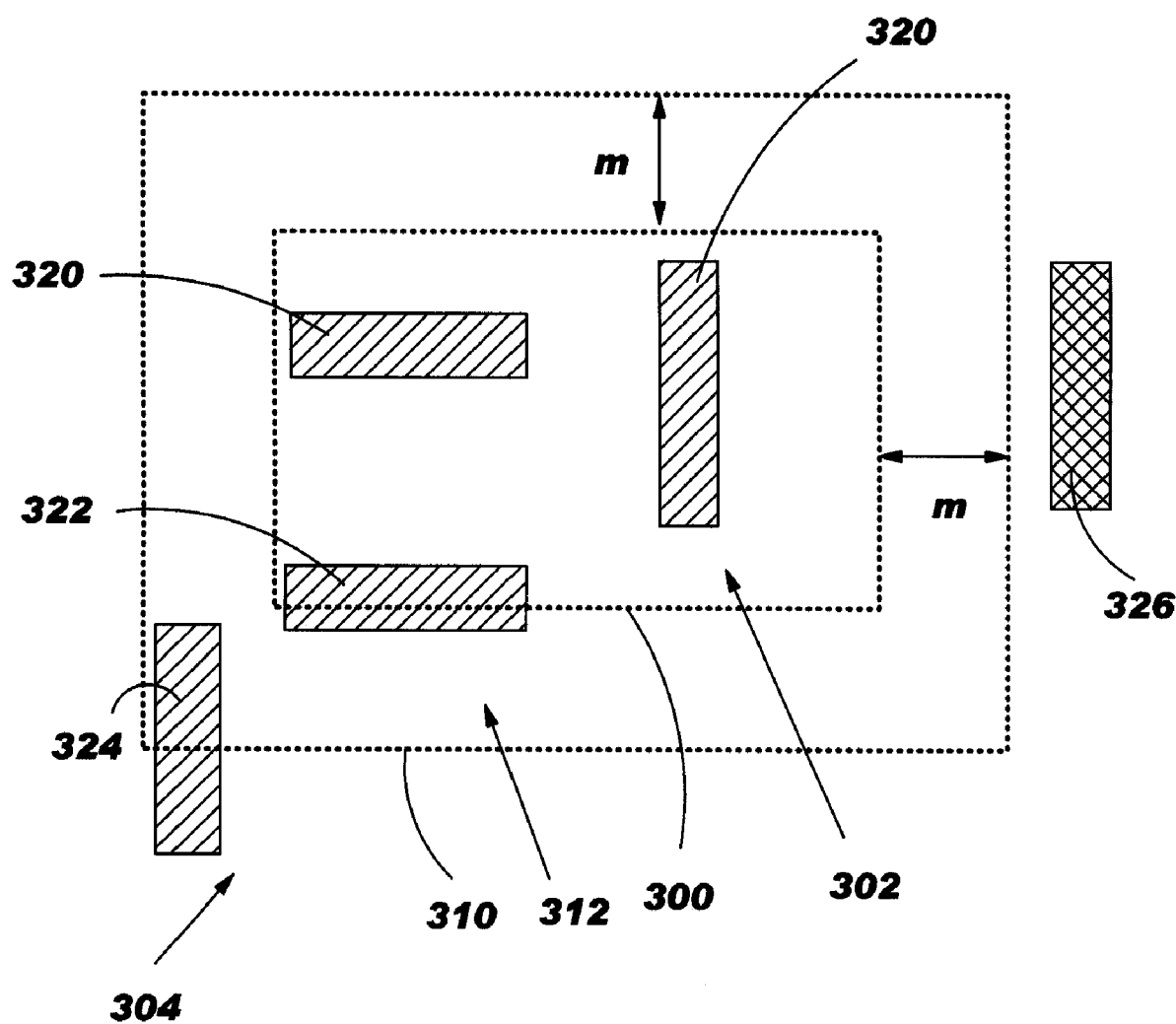
FIG. 13 shows an illustrative IC design for use in explaining the optional embodiment of FIG. 12.

One challenge for computing POF(r) and critical area based on the above-described embodiments is that shapes excluded from the critical area analysis may impact the computations. In order to address this situation, the invention implements, as an optional embodiment, a maximum error for POF contribution. Similarly, using that maximum error for POF, a maximum error for a critical area computation can be achieved. FIG. 12 illustrates a flow diagram for this optional embodiment, and FIG. 13 shows an illustrative IC design 304 for use in describing the flow diagram of FIG. 12. FIG. 5 continues to be referenced in the description that follows.

In a first step S201, a computation window 300 is defined by window definer 184 of maximum error determinator 146 in which critical area is to be computed for a region 302 of IC design 304. Computation window 300 then represents a statistical sample for IC design 304. As indicated, some shapes 320 fall entirely within, some shapes 322 partly within and some shapes 324, 326 entirely outside of computation window 300. In a second step S202, an inclusion window 310 is defined by window definer 184 for a region 312 within which all shapes, including partial shapes, e.g., shape 324, are evaluated for critical area computation. Margin m indicates the spacing between computation window 300 and inclusion window 310. Typically, a shape 326 outside of inclusion window 310 can influence critical area within computation window 300 because a critical defect size map (Voronoi diagram) face extends away from a shape and may occupy space within the computation window even if the shape is outside. Window definer 184 may be any now known or later developed system for demarking a window on an IC design, e.g., a graphical user interface box selector, etc.

In step S203, a maximum error for POF contribution for shapes excluded from an inclusion window 310 is determined by maximum error POF implementer 186. In particular, a maximum error for a POF contribution can be determined by expressing the maximum POF(r) contribution of shapes outside inclusion window 310 as follows:

$$\Delta POF(r) = \begin{cases} 0 & 0 \leq r \leq m \\ \frac{2(r-m)(l+h-2(r-m))}{lh} & m \leq r \leq q \quad q = m + \frac{\min(l, h)}{2} \\ 1 & q \leq r \end{cases}$$

where ΔPOF(r) is the maximum POF contribution of shapes outside inclusion window 210 (i.e., upper bound on error), l is a length and h a height of computation window 300, m is the margin between computation window 300 and inclusion window 310, and q is a quotient defined as stated above. The equation implements a tight upper bound on error in the computed POF function, and hence in the critical area computation based thereon. The optional embodiment may be applied to any fault mechanism that uses critical defect size maps to map locations to critical defect sizes, a distance measure based on a polygonal unit shape, or a distance measure that does not distort distance along the x and y axes.

Figure 14:
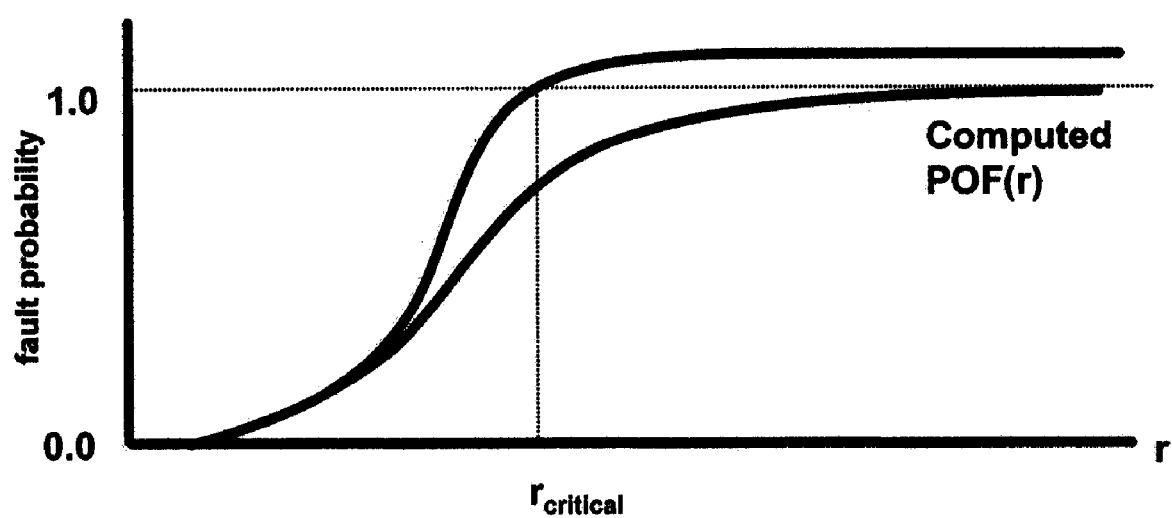
FIG. 14 shows a graph of POF versus defect size illustrating use of a maximum error for POF.

In terms of critical area, step S204, maximum error critical area determinator 188 determines a maximum error in critical area by integrating POF including the above-determined maximum error in POF contribution and defect density from 0 to a defect size, $r_{critical}$. The value $r_{critical}$ is a value at which the sum of the computed and the error POF functions reaches 1. Here, the defect-density function is monotonically decreasing. The maximum error for critical area is given by:

$$\Delta\Theta = \frac{\Delta CriticalArea}{lh} = 1 + \int_0^{rcritical} (POF(r) + \Delta POF(r) - 1)DefectDensity(r)dr,$$

where ΔCriticalArea is a change in critical area, and DefectDensity(r) is a defect density function of r (measure of the probability that a random defect of a particular size r will occur on the chip, independent of the chip design). FIG. 14 illustrates a graph of POF versus defect size r illustrating use of a maximum error for POF. FIG. 14 also illustrates where $r_{critical}$ occurs.

V. Conclusion

It is understood that the order of the above-described steps is only illustrative. To this extent, one or more steps can be performed in parallel, in a different order, at a remote time, etc. Further, one or more of the steps may not be performed in various embodiments of the invention.

It is understood that the present invention can be realized in hardware, software, a propagated signal, or any combination thereof, and may be compartmentalized other than as shown. Any kind of computer/server system(s)—or other apparatus adapted for carrying out the methods described herein—is suitable. A typical combination of hardware and software could be a general purpose computer system with a computer program that, when loaded and executed, carries out the respective methods described herein. Alternatively, a specific use computer, containing specialized hardware for carrying out one or more of the functional tasks of the invention (e.g., system 102), could be utilized. The present invention also can be embedded in a computer program product or a propagated signal, which comprises all the respective features enabling the implementation of the methods described herein, and which—when loaded in a computer system—is able to carry out these methods. Computer program, propagated signal, software program, program, or software, in the present context mean any expression, in any language, code or notation, of a set of instructions intended to cause a system having an information processing capability to perform a particular function either directly or after either or both of the following: (a) conversion to another language, code or notation; and/or (b) reproduction in a different material form. Furthermore, it should be appreciated that the teachings of the present invention could be offered as a business method on a subscription or fee basis. For example, the system and/or computer could be created, maintained, supported and/or deployed by a service provider that offers the functions described herein for customers. That is, a service provider could offer the functionality described above.

While this invention has been described in conjunction with the specific embodiments outlined above, it is evident that many alternatives, modifications and variations will be apparent to those skilled in the art. Accordingly, the embodiments of the invention as set forth above are intended to be illustrative, not limiting. Various changes may be made without departing from the spirit and scope of the invention as defined in the following claims.

What is claimed is:

1. A method of determining a probability of fault (POF) function for an integrated circuit design, the method comprising the steps of:
    constructing a critical defect size map based on a layout geometry of the integrated circuit design under any distance measure defined by a polygonal unit shape; and
    accumulating a POF contribution of each face of the critical defect size map to form a piece-wise two-degree polynomial function representing the POF function; the piece-wise two-degree polynomial function being used to analyze the integrated circuit design.

2. The method of claim 1, further comprising the step of determining an exact critical area of the design by integrating a product of the POF function with a defect density function.

3. The method of claim 1, further comprising the step of determining an exact probability of fault based on a particular defect size.

4. The method of claim 1, further comprising the step of determining a maximum error for POF contribution for shapes excluded from an inclusion window.

5. The method of claim 4, wherein the maximum error determining step includes defining a computation window for a region of the IC design for which the critical area is to be computed;
    defining the inclusion window for a region within which all shapes, including partial shapes, are evaluated for critical area computation; and
    implementing the maximum error by expressing a maximum POF contribution of shapes outside the inclusion window as:

$$\Delta POF(r) = \begin{cases} 0 & 0 \leq r \leq m \\ \frac{2(r-m)(l+h-2(r-m))}{lh} & m \leq r \leq q \\ 1 & q \leq r \end{cases} \quad q = m + \frac{\min(l,h)}{2}$$

where $\Delta POF(r)$ is a maximum POF contribution of shapes outside the inclusion window, l is a length and h a height of the computation window, m is a margin between the computation window and the inclusion window, and q is calculation quotient defined as stated.

6. The method of claim 5, further comprising the step of determining a maximum error for a critical area by integrating the POF function including the maximum error for POF contribution and a defect density function from 0 to a defect size, $r_{critical}$, at which the sum of the computed POF function and the error POF functions reaches 1.

7. A tangible system for determining a probability of fault (POF) function for an integrated circuit design, the system comprising:
    means for constructing a critical defect size map based on a layout geometry of the integrated circuit design under any distance measure defined by a polygonal unit shape; and
    means for accumulating a POF contribution of each face of the critical defect size map to form a piece-wise two-degree polynomial function representing the POF function; the piece-wise two-degree polynomial function being used to analyze the integrated circuit design.

8. The system of claim 7, further comprising means for determining an exact critical area of the design by integrating a product of the POF function with a defect density function.

9. The system of claim 7, further comprising means for determining an exact probability of fault based on a particular defect size.

10. The system of claim 7, further comprising means for determining a maximum error for POF contribution for shapes excluded from an inclusion window.

11. The system of claim 10, wherein the maximum error determining means includes:
    means for defining a computation window for a region of the IC design for which the critical area is to be computed;
    means for defining the inclusion window for a region within which all shapes, including partial shapes, are evaluated for critical area computation; and
    means for implementing the maximum error by expressing a maximum POF contribution of shapes outside the inclusion window as:

$$\Delta POF(r) = \begin{cases} 0 & 0 \leq r \leq m \\ \frac{2(r-m)(l+h-2(r-m))}{lh} & m \leq r \leq q \\ 1 & q \leq r \end{cases} \quad q = m + \frac{\min(l,h)}{2}$$

where $\Delta POF(r)$ is a maximum POF contribution of shapes outside the inclusion window, l is a length and h a height of the computation window, m is a margin between the computation window and the inclusion window, and q is calculation quotient defined as stated.

12. The system of claim 11, further comprising means for determining a maximum error for a critical area by integrating the POF function including the maximum error for POF contribution and a defect density function from 0 to a defect size, $r_{critical}$, at which the sum of the computed POF function and the error POF functions reaches 1.

13. A computer program product comprising a computer useable medium having computer readable program code embodied therein for determining a probability of fault (POF) function for an integrated circuit design, the program product comprising:

program code configured to construct a critical defect size map based on a layout geometry of the integrated circuit design under any distance measure defined by a polygonal unit shape; and program code configured to accumulate a POF contribution of each face of the critical defect size map to form a piece-wise two-degree polynomial function representing the POF function; the piece-wise two-degree polynomial function being used to analyze the integrated circuit design.

14. The program product of claim 13, further comprising program code configured to determine an exact critical area of the design by integrating a product of the POF function with a defect density function.

15. The program product of claim 13, further comprising program code configured to determine an exact probability of fault based on a particular defect size.

16. The program product of claim 13, further comprising the step of determining a maximum error for POF contribution for shapes excluded from an inclusion window.

17. The program product of claim 16, wherein the maximum error determining step includes:

defining a computation window for a region of the IC design for which the critical area is to be computed;

defining the inclusion window for a region within which all shapes, including partial shapes, are evaluated for critical area computation; and implementing the maximum error by expressing a maximum POF contribution of shapes outside the inclusion window as:

$$\Delta POF(r) = \begin{cases} 0 & 0 \le r \le m \\ \frac{2(r-m)(l+h-2(r-m))}{lh} & m \le r \le q \\ 1 & q \le r \end{cases} \quad q = m + \frac{\min(l,h)}{2}$$

where $\Delta POF(r)$ is a maximum POF contribution of shapes outside the inclusion window, l is a length and h a height of the computation window, m is a margin between the computation window and the inclusion window, and q is calculation quotient defined as stated.

18. The program product of claim 17, further comprising the step of determining a maximum error for a critical area by integrating the POF function including the maximum error for POF contribution and a defect density function from 0 to a defect size, $r_{critical}$, at which the sum of the computed POF function and the error POF functions reaches 1.

* * * * *